(12) United States Patent
Schulze et al.

(10) Patent No.: US 12,550,645 B2
(45) Date of Patent: Feb. 10, 2026

(54) METHOD OF FORMING A SEMICONDUCTOR DEVICE INCLUDING AN ABSORPTION LAYER

(71) Applicant: Infineon Technologies AG, Neubiberg (DE)

(72) Inventors: Hans-Joachim Schulze, Taufkirchen (DE); Mihai Draghici, Villach (AT); Matteo Piccin, Villach (AT); Marko David Swoboda, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 562 days.

(21) Appl. No.: 17/946,454

(22) Filed: Sep. 16, 2022

(65) Prior Publication Data

US 2023/0092013 A1 Mar. 23, 2023

(30) Foreign Application Priority Data

Sep. 23, 2021 (DE) .......................... 102021124636.9

(51) Int. Cl.
| | |
|---|---|
| *H01L 21/268* | (2006.01) |
| *H10D 62/10* | (2025.01) |
| *H10D 62/832* | (2025.01) |

(52) U.S. Cl.
CPC ......... *H01L 21/268* (2013.01); *H10D 62/124* (2025.01); *H10D 62/8325* (2025.01)

(58) Field of Classification Search
CPC .................................................. H01L 21/268
See application file for complete search history.

(56) References Cited

U.S. PATENT DOCUMENTS

| | | | | |
|---|---|---|---|---|
| 2003/0008437 A1* | 1/2003 | Inoue | ................ | H01L 21/76254 438/149 |
| 2013/0200427 A1* | 8/2013 | Jeong | .................. | H01L 29/7397 438/135 |
| 2024/0321627 A1* | 9/2024 | Csato | .................... | H01L 21/185 |

FOREIGN PATENT DOCUMENTS

| | | |
|---|---|---|
| DE | 102017131354 A1 | 6/2019 |
| DE | 102019111377 A1 | 11/2019 |
| DE | 102019111985 A1 | 11/2020 |

OTHER PUBLICATIONS

Aichinger et al., A nitrogen-related deep level defect in ion implanted 4H—SiC pn junctions, 2012 (Year: 2012).*
Kamalakkannan et al., Effect of nitrogen ion implantation in semi insulating 6H—SiC and recrystallization probed by Raman scattering, 2019 (Year: 2019).*

* cited by examiner

*Primary Examiner* — Norman D Richards
(74) *Attorney, Agent, or Firm* — Murphy, Bilak & Homiller, PLLC

(57) ABSTRACT

A method of manufacturing a semiconductor device is described. The method includes providing a parent substrate including a substrate portion of a first conductivity type. The method further includes forming an absorption layer in the parent substrate by an ion implantation process of an element through a first surface of the parent substrate. The method further includes forming a semiconductor layer structure on the first surface of the parent substrate. The method further includes splitting the parent substrate along a splitting section through a detachment layer. The detachment layer is arranged between the absorption layer and a second surface of the parent substrate at a vertical distance to the absorption layer.

16 Claims, 4 Drawing Sheets

METHOD OF FORMING A SEMICONDUCTOR DEVICE INCLUDING AN ABSORPTION LAYER

TECHNICAL FIELD

The present disclosure is related to a method of forming a semiconductor device, in particular to a method including forming an absorption layer in a parent substrate by an ion implantation process.

BACKGROUND

Technology development of new generations of semiconductor devices, e.g. insulated gate field effect transistors (IGFETs) such as metal oxide semiconductor field effect transistors (MOSFETs) or insulated gate bipolar transistors (IGBTs) or diodes, aims at improving electric device characteristics, e.g. area-specific on-state resistance. Crystalline semiconductor substrates are typically available in standard sizes, wherein the standard defines diameter and thickness. Attempts have been made to reduce the final thickness of thin semiconductor devices to improve device characteristics. For example, for power semiconductor devices with a vertical load current flow between a front side and a back side, a thinner semiconductor die may result in lower on-state resistance. Other attempts aim at reducing substrate costs by using thin semiconductor slices as base for epitaxial growth. For example, splitting methods horizontally split thin slices or portions from semiconductor parent substrates or horizontally split standard wafers (wafer twinning).

There is a steady need for improving the formation of semiconductor devices.

SUMMARY

An example of the present disclosure relates to a method of manufacturing a semiconductor device. The method includes providing a parent substrate including a substrate portion of a first conductivity type. The method further includes forming an absorption layer in the parent substrate by an ion implantation process of an element through a first surface of the parent substrate. The method further includes forming a semiconductor layer structure on the first surface of the parent substrate. The method further includes splitting the parent substrate along a splitting section through a detachment layer. The detachment layer is arranged between the absorption layer and a second surface of the parent substrate at a vertical distance to the absorption layer.

Another example of the present disclosure relates to a semiconductor device that includes a substrate portion of a first conductivity type. The semiconductor device further includes a buffer layer of the first conductivity type on the substrate portion. The semiconductor device further includes a drift layer of the first conductivity type on the buffer layer. A maximum doping concentration in the drift layer is smaller than a maximum doping concentration in the buffer layer, and a maximum doping concentration in the buffer layer is smaller than a maximum doping concentration in the substrate portion. The semiconductor device further includes an absorption layer in the buffer layer, or in the substrate portion having a vertical distance to the buffer layer in a range from 30 nm to 1 µm, wherein the absorption layer includes at least one of dopants of the first conductivity type or deep-level defects.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of semiconductor device processing features and together with the description serve to explain principles of the examples. Further examples are described in the following detailed description and the claims.

DETAILED DESCRIPTION

Figure 1A:
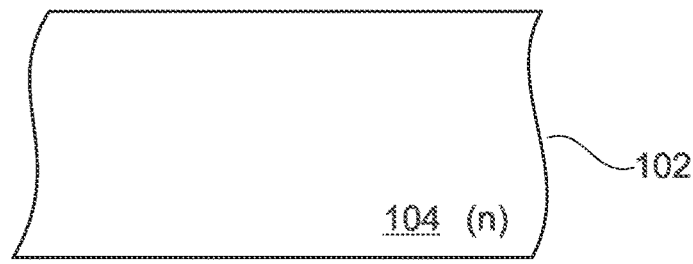
FIGS. 1A to 1D and FIGS. 2A to 2C are schematic cross-sectional views for illustrating process features of a method for manufacturing a semiconductor device including splitting of a parent substrate.

In the following detailed description, reference is made to the accompanying drawings, which form a part hereof and in which are shown by way of illustrations specific examples in which semiconductor substrates may be processed. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state.

If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two elements.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, silicon (Si) and carbon (C) are the main constituents of a silicon carbide (SiC) layer.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a method of manufacturing a semiconductor device may include providing a parent substrate including a substrate portion of a first conductivity type. The method may further include, e.g. after providing the parent substrate, forming an absorption layer in the parent substrate by an ion implantation process of an element through a first surface of the parent substrate. The method may further include, e.g. after forming the absorption layer, forming a semiconductor layer structure on the first surface of the parent substrate. The method may further include, e.g. after forming the semiconductor layer structure, splitting the parent substrate along a splitting section through a detachment layer. The detachment layer may be arranged between the absorption layer and a second surface of the parent substrate at a vertical distance to the absorption layer.

The semiconductor device may be an integrated circuit, or a discrete semiconductor device or a semiconductor module, for example. The semiconductor device may be or include a power semiconductor device, e.g. a vertical power semiconductor device having a load current flow between a first surface and a second surface. The semiconductor device may be or may include a power semiconductor IGFET, e.g. a power semiconductor MOSFET, or a power semiconductor IGBT, or a diode. The power semiconductor device may be configured to conduct currents of more than 1 A or more than 10 A or more than 30 A or more than 50 A or more than 75 A or even more than 100 A, and may be further configured to block voltages between load electrodes, e.g. between emitter and collector of an IGBT, or between drain and source of a MOSFET in the range of several hundreds of up to several thousands of volts, e.g. 400 V, 650V, 1.2 kV, 1.7 kV, 3.3 kV, 4.5 kV, 5.5 kV, 6 kV, 6.5 kV, 10 kV. The blocking voltage may correspond to a voltage class specified in a datasheet of the power semiconductor device, for example.

For example, the parent substrate may be or may include a crystalline SiC semiconductor substrate. For example, the crystalline SiC semiconductor substrate may have a hexagonal polytype, e.g., 4H or 6H. The parent substrate may be homogeneously doped or may include differently doped SiC layer portions, e.g., with a doping concentration of at least $2 \times 10^{17}$ cm$^{-3}$ and at most $5 \times 10^{19}$ cm$^{-3}$, for example of at least $5 \times 10^{17}$ cm$^{-3}$ and at most $1 \times 10^{19}$ cm$^{-3}$ or may be nominally undoped (e.g., with a doping concentration of at most $1 \times 10^{17}$ cm$^{-3}$ or of at most $1 \times 10^{15}$ cm$^{-3}$; so-called "not intentionally doped silicon carbide"). For example, the parent substrate may include, i.e. as differently doped SiC layer portions, a substantially homogeneously doped SiC semiconductor substrate and an epitaxial buffer layer on the SiC semiconductor substrate. For example, the parent substrate may include one or more layers from another material with a melting point close to or higher than crystalline silicon carbide or at least with a melting point exceeding the typical temperatures used for the processing of SiC wafers or substrates. For example, the layers from another material may be embedded in the crystalline SiC semiconductor substrate. The crystalline SiC semiconductor substrate may have two essentially parallel main surfaces of the same shape and size and a lateral surface area connecting the edges of the two main surfaces. For example, the silicon carbide semiconductor substrate may be a rectangular prism with or without rounded edges or a right cylinder or a slightly oblique cylinder (e.g. where the sides lean with an angle of at most 8° or at most 5° or at most 3°) with or without one or more flats or notches along the outer circumference.

The first surface may be a front surface or a top surface of the parent substrate, and the second surface may be a back surface or a rear surface of the parent substrate, for example.

The ion implantation process for forming the absorption layer may include or may be carried out by one or more ion implantations that may differ with respect to at least one of ion implantation energy, ion implantation dose, ion implantation tilt angle (e.g. 0° or any tilt angle between 0° and 90°), ion implantation element. For example, the absorption layer may be formed in a crystalline SiC semiconductor substrate or in a buffer layer of the parent substrate that is arranged on the SiC semiconductor substrate.

Forming the semiconductor layer structure on the first surface of the parent substrate may include forming at least one semiconductor layer, e.g. epitaxial semiconductor layer, by a layer deposition process such as chemical vapor deposition (CVD) on the parent substrate. For example, a thickness of the at least one epitaxial layer may be set depending on a target blocking voltage capability of the semiconductor device. For example, the at least one semiconductor layer may have a thickness of at least 3 µm (or of at least 5 µm, of at least 10 µm, or of at least 20 µm) and of at most 100 µm (or of at most 80 µm or at most 600 µm or of at most 50 µm, or of at most 30 µm). For example, the at least one semiconductor layer may define at least one of a drain region, a buffer region, a backside emitter and a drift region of the semiconductor device.

Forming the semiconductor layer structure may include further processing features, e.g. layer deposition processes for forming insulating layers, or semiconductor layers or conducting layers, etching processes, e.g. via lithographic etch mask(s), for patterning structures, and doping processes for forming doped regions in the at least one semiconductor layer. Exemplary doped regions include source and drain regions or emitter and collector regions, body region(s), body contact region(s), current spread region(s), shielding region(s) configured to shield a gate dielectric from high electric fields, field stop region(s). Exemplary insulating layers include gate dielectric(s), interlayer insulating dielectric(s) in a wiring area above the semiconductor layer structure. Exemplary semiconducting layers include gate electrode(s), field electrode(s), floating electrode(s) formed by highly doped semiconductor materials. Exemplary conducting layers include patterned wiring level(s), e.g. patterned metal wiring layer(s), vias, contact plugs, bond pad(s). For trench gate field effect transistors, a doping concentration in the drift region may be approximately uniform. The drift region may include a current spread sub-region that directly adjoins to the body region and may include a larger doping concentration than other sub-region(s) of the drift region. The current spread region may improve current spreading when the channel current enters the drift region. This may allow for further improvement of the on-state resistance, for example. A mean impurity concentration in the drift region may be between $5 \times 10^{14}$ cm$^{-3}$ and $1 \times 10^{17}$ cm$^{-3}$, for example in a range from $1 \times 10^{15}$ cm$^{-3}$ to $2 \times 10^{16}$ cm$^{-3}$. A vertical extension of the drift region may depend on voltage blocking requirements, e.g. a specified voltage class, of the vertical power semiconductor device. When operating the semiconductor device in voltage blocking mode, a space charge region may vertically extend partly or totally through the drift region depending on the blocking voltage applied to the vertical power semiconductor device.

The detachment layer in the parent substrate may be formed, e.g. prior to the absorption layer, by implanting ions into the parent substrate. The ions may be implanted into the parent substrate within a region extending laterally over the parent substrate. Additionally, the parent substrate wafer with the implanted ions may be annealed to form the detachment layer, for example. The detachment layer may be a lateral detachment layer and/or a buried detachment layer. The detachment layer may laterally extend over the entire parent substrate or over at least 95% of the parent substrate area. For example, the ions may be implanted through a front side surface of the parent substrate. For example, an absorption coefficient of the detachment layer may be higher than an absorption coefficient of the parent substrate portion arranged between the detachment layer and the second surface of the detachment layer. That is to say, the detachment layer may have a higher refractive index (e.g., a higher imaginary part) than the silicon carbide material at least for a target wavelength. The detachment layer in the parent substrate may also be formed by irradiating the parent substrate with a focused laser beam, e.g. without the necessity to implant ions into the parent substrate for forming the detachment layer. The focused laser beam penetrating the parent substrate, e.g. from a backside, may result in the detachment layer by e.g. including small cracks which may result in splitting by applying mechanical force. As a further example, the detachment layer may also be formed as a porous layer in the parent substrate, e.g. by a porousification process such as anodization.

Hereinafter, an absorption coefficient of a layer and/or a material may be the average absorption coefficient of said layer and/or said material, respectively, wherein regions of the layer and/or the material that have an absorption coefficient deviating by more than two standard deviations from the average absorption coefficient may not be accounted for in the average. For example, the absorption coefficient of the detachment layer may be at least 5 times (or at least 10 times, at least 20 times, at least 30 times, or at least 50 times) of the absorption coefficient of the parent substrate surrounding the detachment layer, or the absorption coefficient of the detachment layer may be at least 100 times (or at least 200 times, at least 500 times, at least 850 times, or at least 1000 times) of the absorption coefficient of the parent substrate surrounding the detachment layer, for light of the target wavelength. Achieving an absorption coefficient of the detachment layer e.g. higher than 100 times the absorption coefficient of the parent substrate material outside the detachment layer may be possible by using a concept proposed in the following. The target wavelength may be a characteristic wavelength (e.g. wavelength of laser or maximum in spectrum) of the light used for splitting the parent substrate. For example, the term "light of a target wavelength" may refer to light with a wavelength distribution that has a local, in particular a global, maximum at the target wavelength. In addition or as an alternative, the term "light of a target wavelength" may denote light with a frequency distribution that has a local, in particular a global, maximum that differs by at most 1 GHz (or at most 0.5 GHz or at most 100 MHz) from the frequency corresponding to the target wavelength. However, higher frequency deviations of the local or global maximum of the frequency distribution may be possible, for example, if the energy of the light of the target wavelength exceeds an energy required for chemical decomposition of the detachment layer. Hereinafter, the term "light" is not to be construed as including only visible wavelength, but rather refers to electromagnetic radiation, such as, e.g., visible light, UV light and infrared light.

The ions implanted into the parent substrate may increase the absorption coefficient within the detachment layer compared to the parent substrate material without the implanted ions. For example, an implantation dose may be adjusted and/or a species of the implanted ions may be chosen depending on the parent substrate material, to achieve the higher absorption coefficient and/or to control a value of the absorption coefficient of the absorption layer. Similar to the detachment layer, also the absorption layer located closer to the semiconductor layer structure may have an absorption coefficient that is higher than the absorption coefficient with respect to electromagnetic radiation that is not absorbed within the detachment layer and passes toward the absorption layer. For example, electromagnetic radiation passing through the detachment layer during the splitting process may have the target wavelength, or may have another wavelength caused by interaction of the target wavelength with the detachment layer. The absorption layer may be formed in a way similar to the detachment layer as described above.

For example, the detachment layer may be formed to provide a defined splitting region, e.g. splitting plane, of the parent substrate. Splitting may be achieved by at least irradiating the parent substrate with light of the target wavelength. For example, the parent substrate may be split solely by irradiating the parent substrate. However, additional processes, e.g. heating, applying mechanical stress and/or force and/or ultrasonic treatment may be carried out for supporting the process of splitting the parent substrate.

For splitting the parent substrate an energy of the light of the target wavelength may be selected based on, for example, an energy necessary to split the parent substrate, based on the absorption coefficient of the detachment layer, based on a thickness of the parent substrate, based on a thickness of the detachment layer and/or based on a position of the detachment layer within the parent substrate (e.g., to account for additional absorption by the parent substrate). The light of the target wavelength may be irradiated through the second surface of the parent substrate. Due to the higher absorption coefficient of the detachment layer, a larger portion of the light of the target wavelength may be absorbed within the detachment layer than in the parent substrate outside the detachment layer. For example, the light of the target wavelength absorbed within the detachment layer may cause decomposition or destruction of at least a part, e.g. a laterally connected area, of the detachment layer so that the parent substrate may be split along the splitting section, e.g. a splitting plane, in the detachment layer. Released energy of the light of the target wavelength absorbed within the detachment layer may cause splitting of the parent substrate. By combining the detachment layer with the absorption layer, wherein the absorption layer is located closer to a wiring area than the detachment layer, absorption of the electromagnetic radiation for splitting the parent substrate may be absorbed to a larger extent within the parent substrate. This may allow for a number of benefits, e.g. reduction of energy absorption within the wiring area, or improvement of gate oxide reliability by suppressing or reducing absorption of radiation energy that may cause a change of interface states at the gate oxide, or reduction of bipolar degradation by an increased recombination of holes injected from a front surface of the device during operation. For example, the absorption layer may allow for limiting a temperature at a front surface of the parent substrate during the splitting process, e.g. a surface where the wiring area of the semiconductor device is located, to temperatures below 700° C., or below 600° C., or even below 500° C.

For example, a silicon carbide device wafer and a remaining silicon carbide wafer may be obtained by splitting the parent substrate. Both the remaining silicon carbide wafer and the silicon carbide device wafer may comprise the silicon carbide material of the silicon carbide wafer outside the detachment layer as a main material or may consist of said silicon carbide material.

Examples are described in connection with a silicon carbide parent substrate or wafer. Alternatively, a wide band gap semiconductor wafer may be processed, e.g. comprising a wide band gap semiconductor material different from silicon carbide. The wide band gap semiconductor wafer may have a band gap larger than the band gap of silicon (1.1 eV). For example, the wide band gap semiconductor wafer may be a silicon carbide (SiC) wafer, or gallium arsenide (GaAs) wafer, or a gallium nitride (GaN) wafer. As an alternative to SiC and wide band gap materials, also silicon parent substrates may be used.

For example, the detachment layer may be formed by modifying a substrate material of the parent substrate, e.g. as described in the examples above. For example, the detachment layer may be formed by irradiating the parent substrate with a focused laser beam, or by an ion implantation process, or by a porousification process to form a porous layer.

For example, modifying the substrate material of the parent substrate may include irradiating the parent substrate with electromagnetic radiation configured to be absorbed by a material of the parent substrate. As described above, absorption of the electromagnetic radiation may be higher in the detachment layer than in the surrounding parent substrate. This may damage the crystal bonds inside the detachment layer of the parent substrate and initiate and/or contribute to the splitting process.

For example, the absorption layer is configured to absorb the electromagnetic radiation. For example, absorption of the electromagnetic radiation used for the splitting process may be caused by dopants in the absorption layer. This may allow for avoiding degradation of current flow characteristics, e.g. on-state resistance, of the semiconductor device. For example, nitrogen or phosphorus may be used as the element for the ion implantation processing into a SiC parent substrate, or nitrogen or phosphorus in a silicon parent substrate. As an alternative or in addition to the above dopants in the absorption layer, other dopants may be used that allow for an effective absorption of the electromagnetic radiation used for the splitting process, e.g. dopants or defects (for example Ti, Ti—N-pairs, Ta, Mg in SiC) having deep energy levels with respect to the energy bandgap of the material of the parent substrate and/or allowing for acceptable or low reduction of the effective doping level. Deep energy level dopants or defects may allow for broad absorption characteristic of the electromagnetic radiation that originates from electromagnetic radiation that is used for the splitting process and interacts with the detachment layer. For example, interaction between the electromagnetic radiation used for the splitting process, e.g. laser light having a target wavelength, and the crystal defects in the detachment layer may result in secondary electromagnetic radiation having another wavelength than the target wavelength. This secondary electromagnetic radiation may also be absorbed by the absorption layer as well as electromagnetic radiation of the target wavelength that is not absorbed in the detachment layer during the splitting process.

For example, the vertical distance between the detachment layer and the absorption layer may range from 30 nm to 1 µm, or between 0.1 µm to 0.8 µm. The absorption layer is located close to the splitting section of the detachment layer, and a space charge region of the semiconductor device may not reach the absorption layer in a voltage blocking mode within the specified maximum ratings of the semiconductor device.

For example, a full width at half maximum, FWHM, of a vertical concentration of the element ranges from 0.05 µm to 1 µm, or from 0.1 µm to 0.8 µm.

For example, forming the semiconductor layer structure may include forming a buffer layer of the first conductivity type on the parent substrate, and forming a drift layer of the first conductivity type on the buffer layer. A maximum doping concentration of the buffer layer may be larger than a maximum doping concentration of the drift layer.

For example, the absorption layer may be formed after forming the buffer layer, and before forming the drift layer. For example, the detachment layer may be formed before forming the buffer layer by at least one ion implantation process. In some other examples, the absorption layer may be formed before forming the buffer layer, e.g. after forming the detachment layer. In some other examples, the absorption layer may be formed after forming a first part of the buffer layer and before forming a second part of the buffer layer.

For example, forming the semiconductor layer structure may include forming a drift layer of the first conductivity type on the parent substrate. The absorption layer may be formed before forming the buffer layer. An impurity or doping concentration in the drift layer may gradually or in steps increase or decrease with increasing distance to the parent substrate at least in portions of its vertical extension. According to other examples the impurity concentration in the drift layer may be approximately uniform in a vertical direction.

For example, an ion implantation depth of the ion implantation process may range from 30 nm to 1 µm.

For example, an ion implantation dose of the element may range from 10% to 120% of an amorphization dose.

For example, the ion implantation process is carried out with the parent substrate heated to a temperature of at least 300° C. When the element is implanted through the first surface of the parent substrate, defects such as vacancies may occur at the first surface and/or in a region near the first surface. With a higher implantation dose, the defect density may increase. Such defects, e.g. above a critical defect density, may limit a quality of an epitaxial layer grown on the first surface, for example. By heating the parent substrate while implanting the element through the first surface, an increased implantation dose for forming the absorption layer with an increased absorption coefficient may be achieved while keeping a defect concentration, e.g. a maximal vacancy concentration, of a parent substrate below a limit. For example, a temperature of the parent substrate during ion implantation of the element may be at least 300° C., or at least 350° C., or at least 400° C., or at least 450° C., or at least 500° C., or at least 600° C., at least 700° C., or at least 800° C.) and/or at most 1000° C. (or at most 800° C., at most 700° C., or at most 600° C.). For example, before implanting the element into the parent substrate to form the absorption layer, the parent substrate may be heated to a temperature of at least 300° C. and the temperature of the parent substrate may be kept at a temperature above 300° C. during ion implantation of the element. For example, ion implantation of the element may be carried out by one, two or even more implantation processes and an intermediate process such as e.g. annealing or layer growth in between. Accordingly, the element may be implanted with a first implantation dose. After implanting the element with the first implantation dose, a separate process may be performed to obtain a surface of the parent substrate with reduced near surface crystal defects or less near surface crystal defects (e.g. lower defect density), for example. Subsequently, implanting the element may comprise implanting the element with a second implantation dose after obtaining the parent substrate surface with reduced near surface crystal defects. The element may thus be implanted with the second implantation dose through a surface with reduced or lower defect density.

For example, the method may further comprise forming a wiring area above the semiconductor layer structure before splitting the parent substrate.

An example of a semiconductor device may include a substrate portion of a first conductivity type. The semiconductor device may further include a buffer layer of the first conductivity type on the substrate portion. The semiconductor device may further include a drift layer of the first conductivity type on the buffer layer. A maximum doping concentration in the drift layer may be smaller than a maximum doping concentration in the buffer layer, and a maximum doping concentration in the buffer layer may be smaller than a maximum doping concentration in the substrate portion. The semiconductor device may further include an absorption layer in the buffer layer, or in the substrate portion. The absorption layer may have a vertical distance to the buffer layer in a range from 30 nm to 1 µm. The absorption layer may include at least one of dopants of the first conductivity type or deep-level defects. For example, the absorption layer may support current spreading at a rear side of the semiconductor device and may thus counteract undesired current filamentation, e.g. when operation the semiconductor device under extreme load conditions. While the detachment layer used for splitting the substrate portion from the parent substrate may not be present in the finalized semiconductor device, the absorption layer supporting the splitting process may remain within the finalized semiconductor device.

For example, the semiconductor device may be a SiC power semiconductor device, and a vertical distance between the absorption layer and a contact at a surface of the substrate portion may range from 1 µm to 150 µm or from 5 µm to 100 µm or from 10 µm to 80 µm. The contact may define or may be part of a rear side structure, e.g. a collector electrode, or a drain electrode.

For example, a full width at half maximum, FWHM, of a vertical concentration of an element defining the absorption layer in SiC may range from 0.05 µm to 1 µm. The element may be a dopant or a deep-level defect, for example.

More details and aspects are mentioned in connection with the examples described above or below. Processing the parent substrate and the semiconductor layer structure may comprise one or more optional additional features corresponding to one or more aspects mentioned in connection with the proposed concept or one or more examples described above or below.

The aspects and features mentioned and described together with one or more of the previously described examples and figures, may as well be combined with one or more of the other examples in order to replace a like feature of the other example or in order to additionally introduce the feature to the other example.

It will be appreciated that while the method is described above and below as a series of steps or events, the described ordering of such steps or events are not to be interpreted in a limiting sense. Rather, some steps may occur in different orders and/or concurrently with other steps or events apart from those described above and below.

Functional and structural details described with respect to the examples above shall likewise apply to the examples illustrated in the figures and described further below.

Referring to the schematic cross-sectional views of FIGS. 1A to 1D, exemplary process features for manufacturing a semiconductor device are illustrated.

Referring to the schematic cross-sectional view of FIG. 1A, an n-doped parent substrate 102 is provided. The parent substrate may include none, one or several semiconductor layers, e.g. a buffer layer, on a semiconductor wafer 104, for example.

Figure 1B:
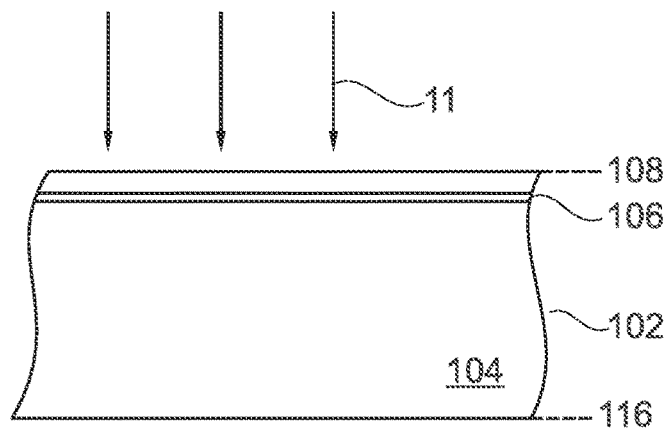

Referring to the schematic cross-sectional view of FIG. 1B, an absorption layer 106 is formed in the parent substrate 102 by an ion implantation process II of an element through a first surface 108 of the parent substrate 102. The absorption layer 106 is configured to absorb electromagnetic radiation used for splitting the parent substrate at the detachment layer at a later stage.

Figure 1C:
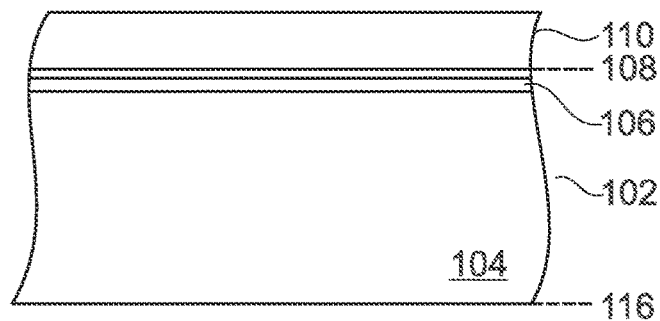

Referring to the schematic cross-sectional view of FIG. 1C, a semiconductor layer structure 110 is formed on the first surface 108 of the parent substrate 102. Further processes may follow, e.g. processes for defining structural device elements in or over the semiconductor layer structure 110. For example, all or multiple front side processes may be carried out, e.g. forming doped regions in the semiconductor layer structure, forming planar or trench control electrode (e.g. gate electrode) or field electrode structures, forming a wiring area over the semiconductor layer structure 110.

Figure 1D:
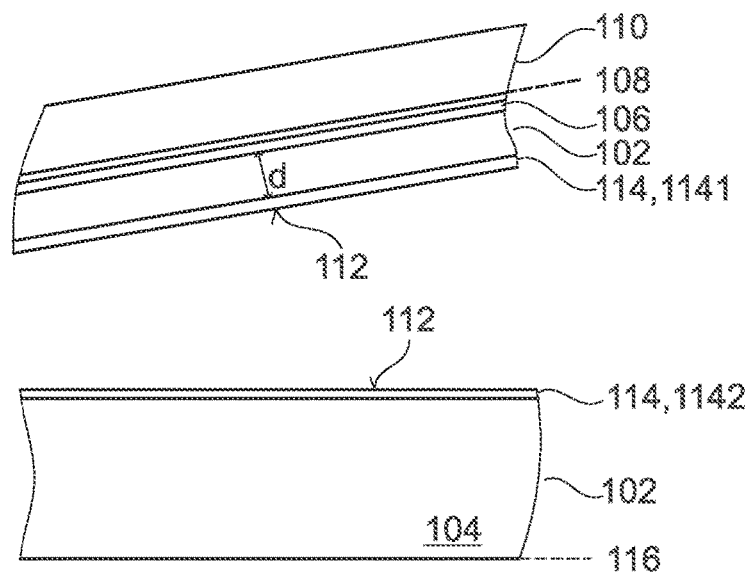

Referring to the schematic cross-sectional view of FIG. 1D, the parent substrate 102 is split along a splitting section 112, e.g. a plane through a detachment layer 114. The detachment layer 114 is arranged between the absorption layer 106 and a second surface 116 of the parent substrate 102 at a vertical distance d to the absorption layer 106.

Figure 2A:
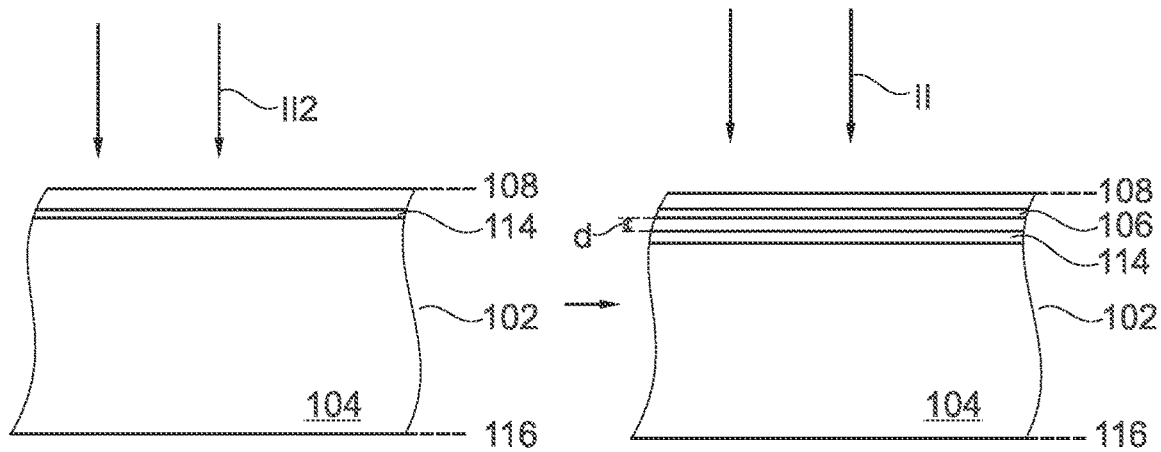
Figure 2B:
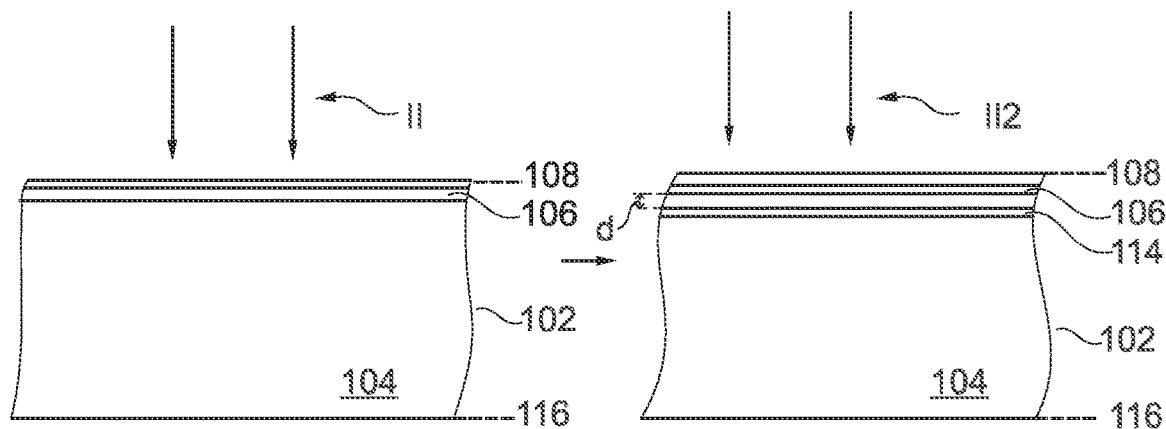
Figure 2C:
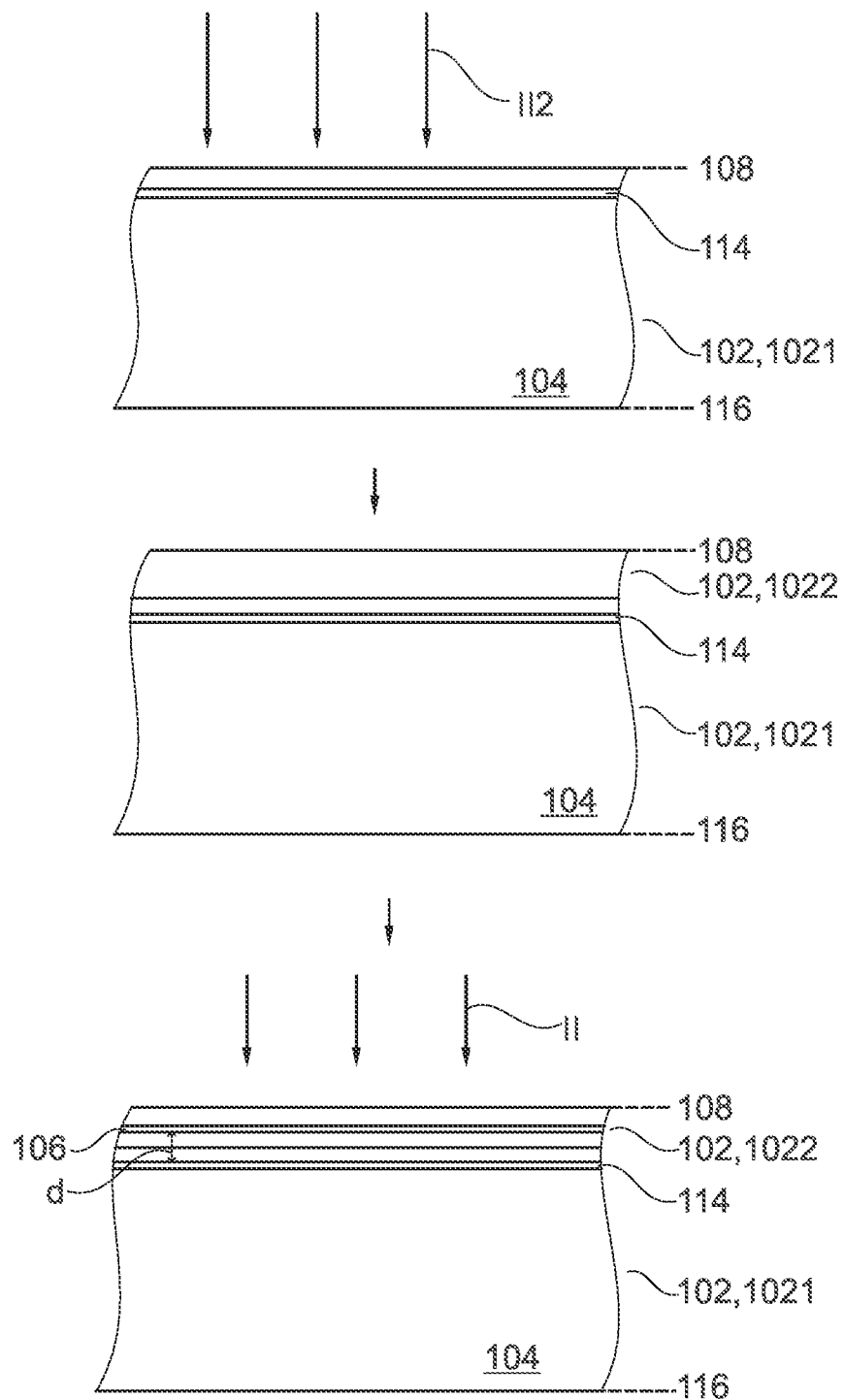

As is illustrated in the schematic cross-sectional views of FIGS. 2A to 2C, the absorption layer 106 may be formed by the ion implantation process II after forming the detachment layer 114 by an ion implantation process 112 (see FIG. 2A). The absorption layer 106 may also be formed before forming the detachment layer 114 (see FIG. 2B). Further processes may be carried out between formation of the detachment layer 114 and the absorption layer 106. As is illustrated in FIG. 2C, a thickness of the parent substrate 102 is increased by adding a second parent substrate portion 1022 on a first parent substrate portion 1021 by means of a layer deposition process, for example. The detachment layer 114 may be formed by the ion implantation process 112 into the first parent substrate portion 1021, and the absorption layer 106 may be formed by the ion implantation process II into the second parent substrate portion 1022. Since at least part of the second parent substrate portion 1022 remains within the semiconductor device, parameters of the second parent substrate portion, e.g. doping concentration, thickness, crystal structure may be set depending on the functional purpose of this part in the finalized semiconductor device. For example, the functional purpose may relate to a buffer layer, a field stop layer, a rear side charge carrier injection layer, a drain or collector layer, a cathode layer.

Figure 3:
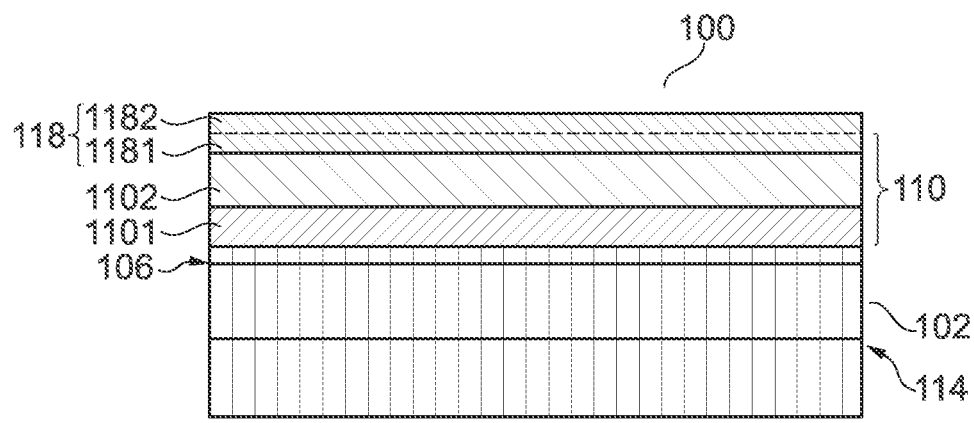
FIG. 3 is a schematic cross-sectional view for illustrating front side processing before splitting the parent substrate.

Referring to the schematic cross-sectional view of FIG. 3, front side processing of the parent substrate 102 and the semiconductor layer structure 110 may be carried out before splitting the parent substrate 102. In view of the vast variety of semiconductor devices that may be formed, front side processing of the parent substrate 102 and the semiconductor layer structure 110 is simplified by a resulting front side structure 118. Structural features of the front side structure 118 depend on the specific semiconductor device 100 that is formed. For example, the semiconductor layer structure 110 may include a buffer layer 1101, a drift layer 1102, and a first front side structure portion 1181 that includes semiconductor device elements such as doped regions, e.g. source region(s), body region(s), current spread region(s), shielding region(s), anode region(s), trench gate electrode structure(s). The front side structure 118 may also include a second front side structure portion 1182. The second front side structure portion 1182 may be, or may include a wiring area over the semiconductor layer structure 110. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an interlayer dielectric may be arranged. Contact plug(s) or contact line(s) may be formed in openings in the interlayer dielectric to electrically connect parts, e.g. metal lines or contact areas, of different wiring levels to one another.

Figure 4:
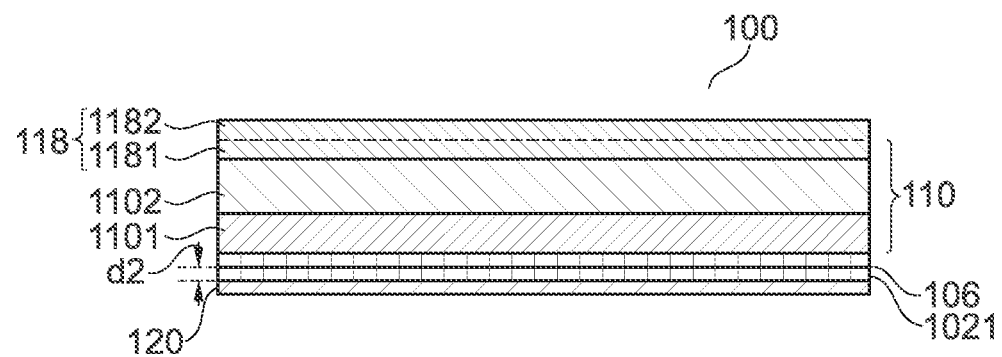
FIG. 4 is a schematic cross-sectional view for illustrating rear side processing after splitting the parent substrate.

Referring to the schematic cross-sectional view of FIG. 4, after splitting the parent substrate 102 into a substrate portion 1021 adjoining the semiconductor layer structure 110 and another substrate portion, rear side processing of the substrate portion 1021 may be carried out. Rear side processing of the substrate portion 1021 is simplified by a resulting rear side structure 120. Structural features of the rear side structure 120 depend on the specific semiconductor device 100 that is formed. For example, the rear side structure may include a rear side electrode, e.g. a metal contact. The other substrate portion that has been split from the substrate portion 1021 may be reused for further splitting processes, for example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof. The first conductivity type may be n-type and the second conductivity type may be p-type. As an alternative, the first conductivity type may be p-type and the second conductivity type may be n-type.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    providing a parent substrate including a substrate portion of a first conductivity type;
    forming an absorption layer in the parent substrate by an ion implantation process of an element through a first surface of the parent substrate;
    forming a semiconductor layer structure on the first surface of the parent substrate;
    splitting the parent substrate along a splitting section through a detachment layer,
    wherein the detachment layer is arranged between the absorption layer and a second surface of the parent substrate at a vertical distance to the absorption layer,
    wherein the splitting comprises irradiating the second surface of the parent substrate,
    wherein an absorption coefficient of the detachment layer is higher than an absorption coefficient of a portion of the parent substrate that is interposed between the detachment layer and the second surface, for electromagnetic radiation of a target wavelength,
    wherein the absorption layer has an absorption coefficient that is higher than an absorption coefficient of a portion of the parent substrate that is interposed between the detachment layer and the absorption layer, for electromagnetic radiation that is not absorbed within the detachment layer and passes toward the absorption layer.

2. The method of claim 1, wherein the vertical distance is in a range of 30 nm to 1 μm.

3. The method of claim 1, wherein forming the absorption layer comprises implanting a dopant of the first conductivity type as the element into the parent substrate.

4. The method of claim 1, wherein forming the absorption layer comprises implanting a deep level defect as the element into the parent substrate.

5. The method of claim 1, wherein a full width at half maximum (FWHM) of a vertical concentration of the element is in a range of 0.05 μm to 1 μm.

6. The method of claim 1, wherein forming the semiconductor layer structure comprises:
    forming a buffer layer of the first conductivity type on the parent substrate; and
    forming a drift layer of the first conductivity type on the buffer layer,
    wherein a maximum doping concentration of the buffer layer is larger than a maximum doping concentration of the drift layer.

7. The method of claim 6, wherein the absorption layer is formed after forming the buffer layer and before forming the drift layer.

8. The method of claim 6, wherein the absorption layer is formed before forming the buffer layer.

9. The method of claim 6, wherein the absorption layer is formed after forming a first part of the buffer layer and before forming a second part of the buffer layer.

10. The method of claim 6, wherein forming the semiconductor layer structure comprises forming a drift layer of the first conductivity type on the parent substrate, and wherein the absorption layer is formed before forming the buffer layer.

11. The method of claim 1, wherein an ion implantation depth of the ion implantation process is in a range of 30 nm to 1 μm.

12. The method of claim 1, wherein an ion implantation dose of the element is in a range of 10% to 120% of an amorphization dose.

13. The method of claim 1, wherein the ion implantation process is carried out with the parent substrate heated to a temperature of at least 300° C.

14. The method of claim 1, further comprising:
before splitting the parent substrate, forming a wiring area above the semiconductor layer structure,
wherein the absorption layer is located closer to the wiring area than the detachment layer.

15. The method of claim 1, wherein, during the splitting, the absorption layer limits a temperature at the first surface of the parent substrate to below 700° C.

16. The method of claim 1, wherein the parent substrate is a SiC substrate, and wherein the absorption layer includes dopants or defects selected from the group consisting of: Ti; Ti—N-pairs; Ta; and Mg.

* * * * *